US012588384B2

(12) United States Patent
Wang et al.

(10) Patent No.: US 12,588,384 B2
(45) Date of Patent: Mar. 24, 2026

(54) DISPLAY BASE PLATE INCLUDING MAIN AND AUXILIARY SPACERS

(71) Applicants:MIANYANG BOE OPTOELECTRONICS TECHNOLOGY CO., LTD., Mianyang (CN); BOE Technology Group Co., Ltd., Beijing (CN)

(72) Inventors: Miao Wang, Beijing (CN); Gaobo Ren, Beijing (CN); Zongqiu Hang, Beijing (CN); Xiaoge Wang, Beijing (CN); Zifeng Wang, Beijing (CN)

(73) Assignees: MIANYANG BOE OPTOELECTRONICS TECHNOLOGY CO., LTD., Mianyang (CN); BOE TECHNOLOGY GROUP CO., LTD., Beijing (CN)

( * ) Notice: Subject to any disclaimer, the term of this patent is extended or adjusted under 35 U.S.C. 154(b) by 438 days.

(21) Appl. No.: 18/024,870

(22) PCT Filed: Mar. 18, 2022

(86) PCT No.: PCT/CN2022/081786
§ 371 (c)(1),
(2) Date: Mar. 6, 2023

(87) PCT Pub. No.: WO2023/173427
PCT Pub. Date: Sep. 21, 2023

(65) Prior Publication Data
US 2024/0292698 A1    Aug. 29, 2024

(51) Int. Cl.
H10K 59/35      (2023.01)
H10K 59/122     (2023.01)
H10K 59/80      (2023.01)

(52) U.S. Cl.
CPC ......... H10K 59/353 (2023.02); H10K 59/122 (2023.02); H10K 59/352 (2023.02); H10K 59/873 (2023.02)

(58) Field of Classification Search
CPC ... H10K 59/353; H10K 59/122; H10K 59/352
See application file for complete search history.

(56) References Cited

U.S. PATENT DOCUMENTS 10,283,086 B1 *  5/2019  Su ............................ G09G 5/02
2015/0200237 A1 *  7/2015  Yim .................. H10K 50/8428
257/40

(Continued)

FOREIGN PATENT DOCUMENTS

CN      113421910 A  *  9/2021  ........... H10K 59/352
CN      113823669 A  *  12/2021  ........... H10K 59/122

*Primary Examiner* — Ida M Soward
(74) *Attorney, Agent, or Firm* — WHDA, LLP

(57) ABSTRACT

The display base plate includes a substrate and first subpixels, second subpixels, third subpixels and a group of spacers which are located on the substrate; one of the first subpixels are at least located at vertexes of the first virtual polygon, one of the second subpixels are at least located inside the first virtual polygon, and one of the third subpixels are located inside the first virtual polygon; and the group of spacers is disposed inside the first virtual polygon, and the group of spacers includes at least one main spacer and a plurality of auxiliary spacers; wherein an area where the main spacer is located and an area where the second virtual quadrilateral is located at least partially overlap, and the second virtual quadrilateral is located within a central area of the first virtual polygon.

19 Claims, 12 Drawing Sheets

(56) References Cited

U.S. PATENT DOCUMENTS

| | | | |
|---|---|---|---|
| 2017/0263691 A1 | 9/2017 | Seo et al. | |
| 2018/0197922 A1 | 7/2018 | Song | |
| 2018/0247984 A1* | 8/2018 | Wang | H10K 59/353 |
| 2022/0310710 A1* | 9/2022 | Hu | H10K 59/353 |
| 2022/0336539 A1* | 10/2022 | Luo | H10K 59/353 |
| 2022/0336541 A1* | 10/2022 | Niu | H10K 59/352 |
| 2022/0399423 A1* | 12/2022 | Du | H10K 59/131 |
| 2023/0084896 A1* | 3/2023 | Zhang | H10K 50/8428 |
| | | | 257/89 |

* cited by examiner

DISPLAY BASE PLATE INCLUDING MAIN AND AUXILIARY SPACERS

TECHNICAL FIELD

The present application relates to the technical field of displaying and, more particularly, to a display base plate and a display apparatus.

BACKGROUND

Organic light-emitting diode (OLED) display apparatus has become the mainstream displaying products in the market because of its advantages such as wide color gamut, high resolution, high contrast, low power consumption and flexibility. The spacer (PS) in OLED displaying products plays a role in supporting the fine metal mask (FMM) in the evaporation process, but the design of spacer in the related art is relatively simple, and the distribution density of spacer in the active area is high.

SUMMARY

The embodiments of the present application employ the following technical solutions:

In the first aspect, the embodiments of the present disclosure provide a display base plate, including a substrate and first subpixels, second subpixels, third subpixels and a group of spacers which are located on the substrate;

the first subpixels are at least located at vertexes of the first virtual polygon, the second subpixels are at least located inside the first virtual polygon, and the third subpixels are located inside the first virtual polygon; and the group of spacers is disposed inside the first virtual polygon, and the group of spacers includes at least one main spacer and a plurality of auxiliary spacers;

wherein an area where the main spacer is located and an area where the second virtual quadrilateral is located at least partially overlap, and the second virtual quadrilateral is located in a central area of the first virtual polygon, and at least two vertexes of the second virtual quadrilateral are provided with the first subpixels; and the plurality of auxiliary spacers are located in the first virtual polygon and are disposed around the second virtual quadrilateral.

In some embodiments of the present disclosure, the first virtual polygon is a first virtual quadrilateral, and the group of spacers includes one main spacer and four auxiliary spacers; and an area where the auxiliary spacer is located overlaps with areas where the third virtual quadrilaterals are located, and four third virtual quadrilaterals are disposed around the second virtual quadrilateral, and at least one side edge of the third virtual quadrilaterals is collinear with one side edge of the first virtual quadrilateral.

In some embodiments of the present disclosure, each side edge of the first virtual quadrilateral is provided with four first subpixels and three second subpixels, and one of the first subpixels and the second subpixels located on each side of the first virtual quadrilateral are arranged at interval; and two side edges of the third virtual quadrilateral are collinear with two side edges of the first virtual quadrilateral, and a vertex of the third virtual quadrilateral and a vertex of the first virtual quadrilateral are common-vertex.

In some embodiments of the present disclosure, four vertexes of the second virtual quadrilateral are provided with the first subpixels, four side edges of the second virtual quadrilateral are provided with the second subpixels, and a geometric center of the second virtual quadrilateral is provided with the third subpixel; and the second subpixels are provided at a set of two opposite vertexes of the third virtual quadrilateral, wherein one of the first subpixels is provided at one vertex shared with the first virtual quadrilateral, one of the third subpixels is provided at the other vertex.

In some embodiments of the present disclosure, one set of two opposite side edges of the first virtual quadrilateral is provided with five first subpixels, the other set of two opposite side edges of the first virtual quadrilateral is provided with four first subpixels, and the two side edges provided with four first subpixels partially overlap with outer contours of three third subpixels, respectively; and each of the third virtual quadrilateral is a virtual trapezoid, and a lower bottom edge of the virtual trapezoid is collinear with one side edge of the first virtual quadrilateral, a vertex on the lower bottom edge of the virtual trapezoid and a vertex of the first virtual quadrilateral are common-vertex.

In some embodiments of the present disclosure, the first subpixels are arranged at one set of two opposite vertexes of the second virtual quadrilateral, one of the second subpixels and one of the third subpixels are arranged at the other set of two opposite vertexes of the second virtual quadrilateral; and the first subpixels are arranged at the two vertexes on the lower bottom edge of the virtual trapezoid, and one of the second subpixels and one of the third subpixels are arranged at the two vertexes on an upper bottom edge of the virtual trapezoid.

In some embodiments of the present disclosure, six first subpixels are arranged at one set of two opposite side edges of the first virtual quadrilateral, and seven first subpixels are arranged at the other set of two opposite side edges of the first virtual quadrilateral; and one side edge of the third virtual quadrilateral is collinear with one side edge of the first virtual quadrilateral, and midpoints of the four side edges of the first virtual quadrilateral are located on one side edge of the third virtual quadrilateral.

In some embodiments of the present disclosure, the first subpixels are arranged at one set of two opposite vertexes of the second virtual quadrilateral, and one of the second subpixels and one of the third subpixels are arranged at the other set of two opposite vertexes of the second virtual quadrilateral, and one of the second subpixels includes two subpixel parts; luminescent areas of the two subpixel parts are not connected to each other; and the first subpixels are arranged at four vertexes of the third virtual quadrilateral, and one second subpixel and one third subpixel are arranged inside the third virtual quadrilateral.

In some embodiments of the present disclosure, an outer contour of an area where the main spacer is located is located within an outer contour of the second virtual quadrilateral.

In some embodiments of the present disclosure, the main spacer is located between one of the first subpixels and the third subpixel.

In some embodiments of the present disclosure, a maximum size of an orthographic projection of the main spacer on the substrate along a first direction is regarded as a first size, and a maximum size of the orthographic projection of the main spacer on the substrate along a second direction is regarded as a second size;

wherein the first size is less than or equal to the second size; the first direction is a direction of one of the first subpixels pointing to one of the third subpixels in the fourth virtual quadrilateral, and the second direction is a direction of one second subpixel pointing to the other second subpixel in the fourth virtual quadrilateral; four fourth virtual quadrilaterals form a second virtual quadrilateral.

In some embodiments of the present disclosure, the shape of the orthographic projection of the main spacer on the substrate is an ellipse, and a long axis direction of the ellipse is consistent with the second direction.

In some embodiments of the present disclosure, for one first virtual quadrilateral, a pattern formed by successively connecting geometric centers of auxiliary spacers is a square.

In some embodiments of the present disclosure, the area where the main spacer is located at least partially overlaps with the area where the second virtual quadrilateral is located.

In some embodiments of the present disclosure, the main spacer is located between one of the first subpixels and the second subpixel.

In some embodiments of the present disclosure, for one first virtual quadrilateral, a distance difference between geometric centers of the auxiliary spacers and geometric centers of the main spacers are less than or equal to a maximum size of a pixel unit, the pixel unit includes the first subpixel, one of the second subpixels and the third subpixel.

In some embodiments of the present disclosure, for one second virtual quadrilateral, a minimum distance between the main spacer and one of the first subpixels is less than a minimum distance between the main spacer and the third subpixel, and a minimum distance between the main spacer and one of the second subpixels is less than the minimum distance between the main spacer and the third subpixel.

In some embodiments of the present disclosure, the display base plate includes a pixel-defining layer located on the substrate, and the pixel-defining layer has a plurality of openings arranged in an array, and subpixels are at least located in the openings; and the pixel-defining layer further includes a plurality of recesses arranged in an array, a number of the recesses is greater than or equal to a number of the main spacers, and the main spacer is located in the recesses, an outer contour of an orthographic projection of the main spacer on the substrate is located within outer contours of orthographic projections of the recesses on the substrate.

In some embodiments of the present disclosure, the display base plate further includes an encapsulating layer and a covering layer, the covering layer at least fills an area of the recesses where no main spacer is arranged; and the encapsulating layer covers the pixel-defining layer, the subpixel and the covering layer.

In some embodiments of the present disclosure, a minimum distance between the recess along a direction parallel to a plane where the substrate is located and neighboring opening is greater than or equal to 1.35 μm.

In some embodiments of the present disclosure, one of the first subpixels includes a blue luminescent function layer, one of the second subpixels includes a green luminescent function layer, and one of the third subpixels includes a red luminescent function layer.

In the second aspect, an embodiment of the present application provides a display apparatus, including the display base plate stated above.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly described below. Apparently, the figures that are described below are merely embodiments of the present application, and a person skilled in the art can obtain other figures according to these figures without paying creative work.

DETAILED DESCRIPTION

Figure 1:
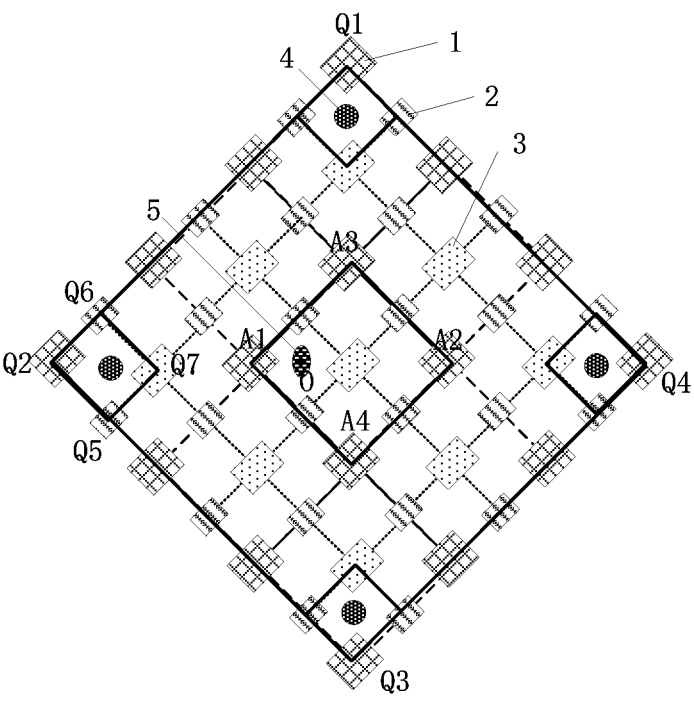
FIG. 1 to FIG. 20 are schematic diagrams showing the distributions of the groups of spacers in 20 display base plates according to the embodiments of the present application, respectively.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the drawings, in order for clarity, the thicknesses of the areas and the layers might be exaggerated. In the drawings, the same reference numbers represent the same or similar components, and therefore the detailed description on them are omitted. Moreover, the drawings are merely schematic illustrations of the present disclosure, and are not necessarily drawn to scale.

Unless stated otherwise in the context, throughout the description and the claims, the term "include" is interpreted as the meaning of opened containing, i.e., "including but not limited to". In the description of the present disclosure, the terms "one embodiment", "some embodiments", "exemplary embodiments", "example", "specific example" or "some examples" are intended to indicate that specific features, structures, materials or characteristics related to the embodiment or example are included in at least one embodiment or example of the present application. The illustrative indication of the above terms does not necessarily refer to the same one embodiment or example. Moreover, the specific features, structures, materials or characteristics may be included in any one or more embodiments or examples in any suitable manner.

In the embodiments of the present application, terms such as "first" and "second" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

In the process of the development of the organic light emitting diode (OLED) displaying technology, the spacer is used as the umbrella of the display area to prevent the existing film layer being scratched in the display base plate caused by the fine metal mask (FMM) during the evaporating and aligning of the luminescent function layer material.

In the organic light emitting diode (OLED) displaying products in the related art, the scratch rate of the display base plate is high. Under the harsh environment of high temperature and high humidity, the subpixel near the scratch position is easy to fail. And the failure rate is as high as 30%, resulting in a decrease in the display effect.

In order to meet the support of the spacer to the FMM mask and reduce the scratch rate, in the related art, a single spacer is designed, and the distribution density of the spacer in the active area of the display base plate is very high. The high-density spacer design, on the one hand, occupies more space in the display base plate; on the other hand, it increases the risk of the spacer itself being crushed by the FMM mask, resulting in the abnormality of the display base plate, which includes but is not limited to the dark spots in the displaying screen, the falling film particles in the active area or the encapsulation failure of the luminescent function layer.

Based on this, the embodiment of the present application provides a display base plate, including: a substrate and first subpixels 1, second subpixels 2, third subpixels 3 and a group of spacers which are located on the substrate.

Figure 2:
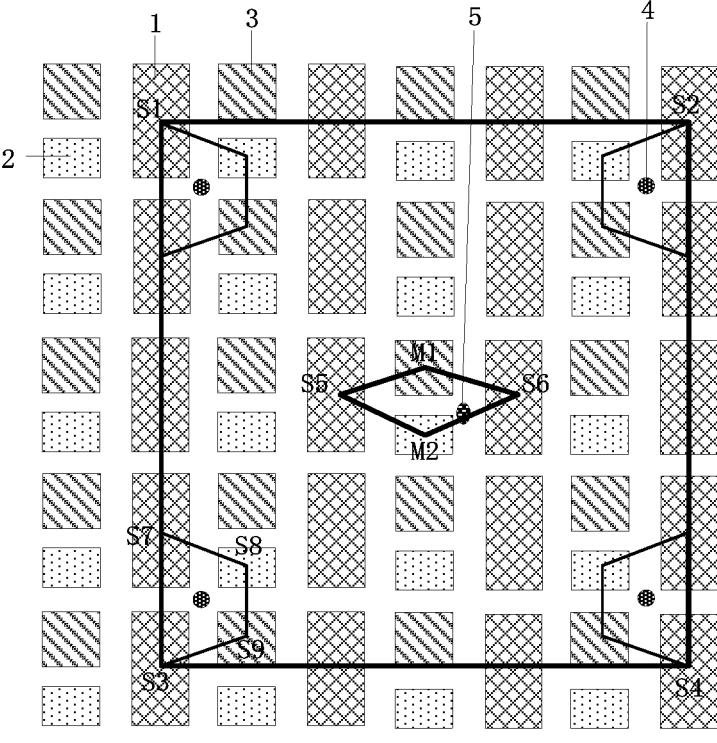
Figure 3:
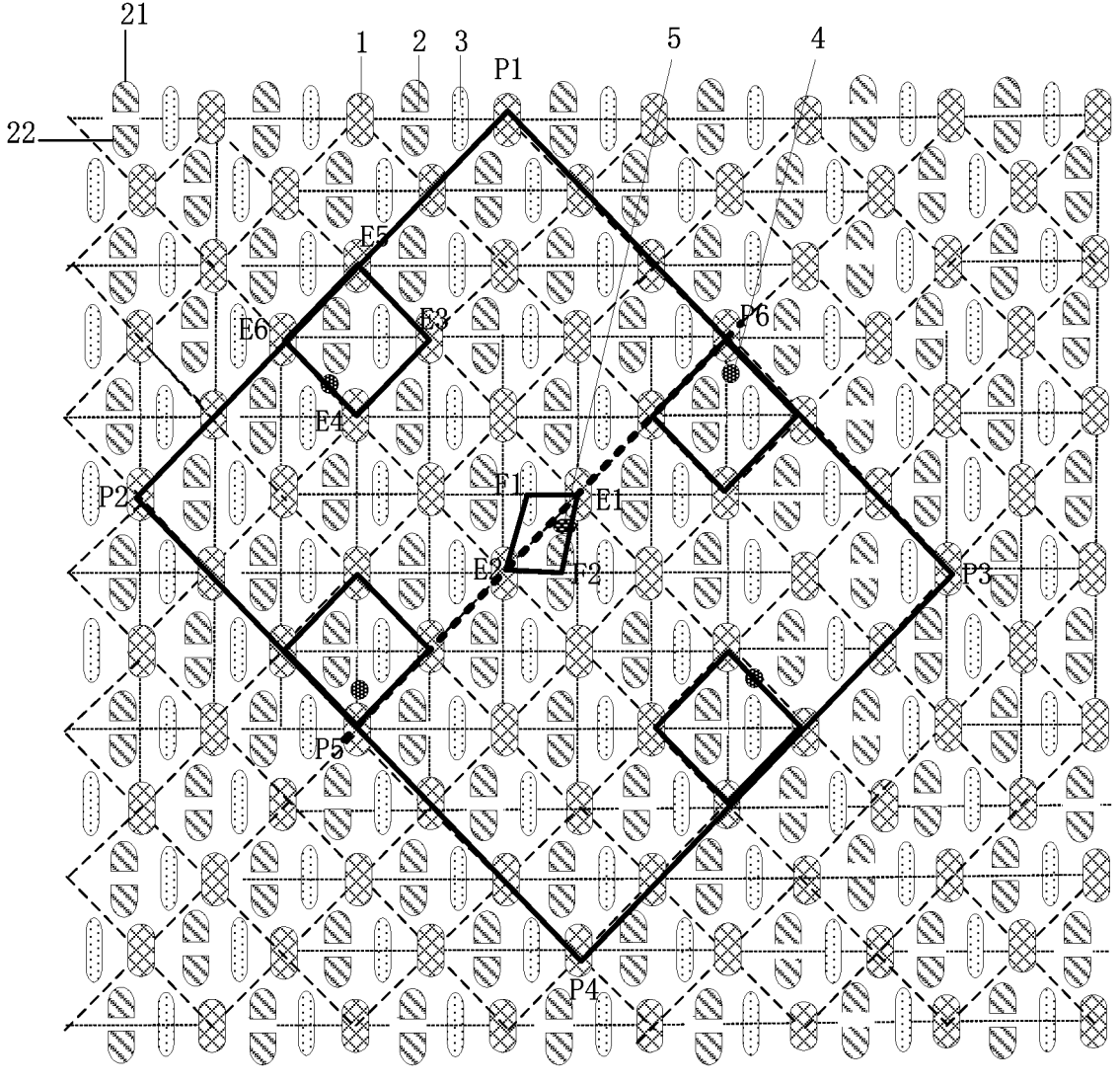

Referring to FIG. 1, FIG. 2 or FIG. 3, the first subpixels 1 are at least located at the vertexes of the first virtual polygon (such as vertexes of Q1, Q2, Q3 and Q4 of the first virtual polygon in FIG. 1, vertexes of S1, S2, S3 and S4 of the first virtual polygon in FIG. 2, and vertexes of P1, P2, P3 and P4 of the first virtual polygon in FIG. 3). The second subpixels 2 are at least located inside the first virtual polygon, and the third subpixels 3 are located inside the first virtual polygon. A group of spacers is disposed inside the first virtual polygon. The group of spacers includes at least one main spacer 5 and a plurality of auxiliary spacer 4.

An area where the main spacer 5 is located and an area where the second virtual quadrilateral is located at least partially overlap, and the second virtual quadrilateral (such as second virtual quadrilateral of A1, A2, A3 and A4 in FIG. 1, second virtual quadrilateral of M1, M2, S5 and S6 in FIG. 2, second virtual quadrilateral of F1, F2, E1 and E2 in FIG. 3) is located in a central area of the first virtual polygon, and at least two vertexes of the second virtual quadrilateral are provided with the first subpixels 1; and the plurality of auxiliary spacers 4 are located in the first virtual polygon and are disposed around the second virtual quadrilateral.

The above 'located' generally means that the center point of the subpixel (1, 2 or 3) overlaps with the vertex, the side edge or the internal area of the first virtual polygon or the second virtual quadrilateral. The meaning of the similar description hereafter is similar to that herein, which is not repeated again.

The central point of the subpixel may be the geometric center of the patterning of the subpixel, or may be the center of the luminescent area of the subpixel, wherein the center of the luminescent area refers to the position where the luminous intensity is largest.

In an exemplary embodiment, the shapes of the subpixels may be polygon, such as a triangle, a quadrilateral, a pentagon and other regular polygons; alternatively, the shapes of subpixels may be irregular shapes that are removed or added to the polygon, and which is not limited herein in the present application.

In an exemplary embodiment, the displaying colors of subpixels may be the same or different, which is determined according to the actual situation.

In an exemplary embodiment, the displaying color of one of the first subpixels 1 is blue, the displaying color of one of the second subpixels 2 is green, and the displaying color of one of the third subpixels 3 is red.

In an exemplary embodiment, the meaning that one of the first subpixels 1 may be at least located at the vertex position of the first virtual polygon is: one of the first subpixels 1 may be located at the vertex position of the first virtual polygon; alternatively, referring to FIG. 1, one of the first subpixels 1 may be not only located at the vertex position of the first virtual polygon, but also be located on the side edge of the first virtual polygon and inside the first virtual polygon.

Alternatively, referring to FIG. 2 and FIG. 3, one of the first subpixels 1 may not only be located at the vertex position of the first virtual polygon, but also be located inside the first virtual polygon.

In an exemplary embodiment, the meaning that one of the second subpixels 2 is at least located inside the first virtual polygon is: referring to FIG. 2 or FIG. 3, one of the second subpixels 2 may be located inside the first virtual polygon; alternatively, referring to FIG. 1, one of the second subpixels 2 may be located inside the first virtual polygon or on the side edge of the first virtual polygon.

In an exemplary embodiment, the meaning that the group of spacers is located inside the first virtual polygon is: the outer contour of the area where the group of spacers is located is located within the outer contour of the first virtual polygon; alternatively, the outer contour of the area where the group of spacers is located is located within the outer contour of the first virtual polygon, and the outer contour of the area where the group of spacers is located partially overlaps with the outer contour of the first virtual polygon.

In an exemplary embodiment, the first virtual polygon may be a first virtual polygon, or, the first virtual polygon may be a first virtual hexagon.

Exemplarily, when the first virtual polygon is the first virtual quadrilateral, the group of spacers may include one main spacer and four auxiliary spacers, wherein one main spacer may be located in the central area of the first virtual quadrilateral. Four auxiliary spacers may be disposed close to four vertexes or four side edges of the first virtual quadrilateral.

Exemplarily, when the first virtual polygon is the first virtual hexagon, the group of spacers may include one main spacer and six auxiliary spacers, wherein one main spacer may be located in the central area of the first virtual hexagon and four auxiliary spacers may be close to six vertexes or six side edges of the first virtual hexagon.

That the above second virtual quadrilateral is located in the central area of the first virtual polygon refers to: the geometric center of the first virtual polygon is taken as the center, and the geometric centers of the four subpixels around the geometric center of the first virtual polygon are taken as vertexes to form a virtual pattern.

It should be noted that the virtual shapes mentioned in the embodiments of the present application, such as the similar descriptions of the first virtual polygon and the second virtual quadrilateral mentioned above do not actually exist, but are only concepts proposed for being easy to describe the position relationships of subpixels.

The materials of the main spacer 5 and the auxiliary spacer 4 are the same, and they may be resin materials. For example, the materials of the main spacer 5 and the auxiliary spacer 4 are light transmitting resins.

The height of the main spacer 5 in the direction perpendicular to the substrate of display base plate is greater than the height of the auxiliary spacer 4 in the direction perpendicular to the substrate of the display base plate. Here, for the height difference of the two is not limited, which may be specifically determined according to the actual situation.

In practical applications, masstone mask technology may be used to produce spacers of different heights in a mask, thereby reducing costs.

Here, the projection shapes of the main spacer 5 and the auxiliary spacer 4 in the direction perpendicular to the substrate of the display base plate are not limited. Exemplarily, the projection shapes may be polygons, arcs, or a shape of a combination of polygons and arcs, which may be specifically determined according to the actual situation.

Exemplarily, the polygons may include rectangles, the arcs may include circles or ellipses, and the shapes formed by the combination of the polygons and arcs may include rod-shaped pattern.

The projection shapes of the main spacer 5 and the auxiliary spacer 4 in the direction perpendicular to the substrate of the display base plate may be the same or different.

It should be noted that, in order to distinguish the main spacer 5 from the auxiliary spacer 4, the drawings according to the embodiments of the present application are illustrated by taking that the projection shapes of the main spacer 5 and the auxiliary spacer 4 in the direction perpendicular to the substrate of the display base plate are different as an example. Wherein the projection shape of the main spacer 5 in the direction perpendicular to the substrate of the display base plate is illustrated to be an ellipse, and the projection shape of the auxiliary spacer 4 in the direction perpendicular to the substrate of the display base plate is illustrated to be a circle.

In an exemplary embodiment, a projection area of the auxiliary spacer 4 in the direction perpendicular to the substrate of the display base plate is less than a projection area of the main spacer 5 in the direction perpendicular to the substrate of the display base plate.

Exemplarily, the projection area of the auxiliary spacer 4 in the direction perpendicular to the substrate of the display base plate is $\frac{1}{3}$-$\frac{1}{2}$ of the projection area of the main spacer 5 in the direction perpendicular to the substrate of the display base plate.

In the embodiments of the present application, two neighboring first virtual polygons share at least one side edge or at least one vertex. In practical applications, in order to reduce the probability of the group of spacers (especially the main spacer) being crushed, when the group of spacers plays a sufficient supporting role, the lower the setting density of the group of spacers, the better. Therefore, the group of spacers may be disposed only in some first virtual polygons.

In the evaporation process, the main spacer 5 plays a major supporting role in the FMM mask, and the auxiliary spacer 4 plays an auxiliary supporting role in the FMM mask. When the FMM mask contacts with the main spacer 5 and compresses the main spacer 4, the auxiliary spacer 4 may increase the contact area between the group of spacers and the FMM mask and assist in supporting FMM mask to avoid further compression of the main spacer 5, so as to avoid the main spacer 5 being crushed.

In the embodiments of the present application, in the area where the same one first virtual polygon is located, there is both the main spacer 5 and the auxiliary spacer 4, and the area where the main space r5 is located is located in the central area of the first virtual polygon, which greatly enhances the supporting of the group of spacers to the FMM mask in the local area. In addition, a plurality of auxiliary spacers 4 are disposed around the main spacer 5, so that the plurality of auxiliary spacers 4 may assist the main spacer 5 to support the FMM mask from different angles, improve the uniformity of the pressure on the main spacer 5, avoid the scratch problem caused by the large pressure or uneven pressure on the main spacer 5, and improve the quality of the display base plate, thereby avoiding the poor display effect caused by the spacer scratch. The display effect of the display apparatus prepared by the display base plate is improved.

In some embodiments of the present application, the first virtual polygon is a first virtual quadrilateral, and the group of spacers includes one main spacer 5 and four auxiliary spacers 4; and an area where the auxiliary spacer 4 is located overlaps with areas where the third virtual quadrilaterals are located, and four third virtual quadrilaterals are disposed around the second virtual quadrilateral, and at least one side edge of the third virtual quadrilaterals is collinear with one side edge of the first virtual quadrilateral.

In an exemplary embodiment, the meaning that the area where the auxiliary spacer 4 is located overlaps with the areas where the third virtual quadrilaterals are located is: the area where the auxiliary spacer 4 is located at least partially overlaps with the areas where the third virtual quadrilaterals located.

In an exemplary embodiment, referring to FIG. 1, the first virtual polygon is the first virtual quadrilateral Q1Q2Q3Q4, the group of spacers includes a main spacer 5 and four auxiliary spacers 4; the area where the auxiliary spacer 4 is located overlaps with the areas where the third virtual quadrilaterals (such as the virtual quadrilateral Q2Q5Q6Q7) are located. The four third virtual quadrilaterals are disposed around the second virtual quadrilateral A1A2A3A4. A vertex of third virtual quadrilateral and a vertex of the first virtual quadrilateral are common-vertex, and the two side edges of the third virtual quadrilateral are collinear with the two side edges of the first virtual quadrilateral.

Exemplarily, for the third virtual quadrilateral Q2Q5Q6Q7, one vertex Q2 and the vertex Q2 of the first virtual quadrilateral Q1Q2Q3Q4 are common-vertex, and one side edge Q2Q6 is collinear with the side edge Q2Q1 of the first virtual quadrilateral. The other side edge Q2Q5 is collinear with the other side edge Q2Q3 of the first virtual quadrilateral.

In an exemplary embodiment, referring to FIG. 2, the first virtual polygon is the first virtual quadrilateral S1S2S3S4, the group of spacers includes a main spacer 5 and four auxiliary spacer 4; the area where the auxiliary spacer 4 is located overlaps with the area of the third virtual quadrilateral (such as virtual quadrilateral S3S7S8S9). Four third virtual quadrilaterals are disposed around the second virtual quadrilateral S5S6M1M2, and the third virtual quadrilateral is virtual trapezoid. The lower bottom edge of the virtual trapezoid may be collinear with a side edge of the first virtual quadrilateral, and one vertex on the lower bottom edge of the virtual trapezoid and one vertex of the first virtual quadrilateral are common-vertex.

In an exemplary embodiment, referring to FIG. 3, the first virtual polygon is first virtual quadrilateral P1P2P3P4, the group of spacers includes one main spacer 5 and four auxiliary spacers 4; the area where the auxiliary spacer 4 is located overlaps with the areas where the third virtual quadrilaterals (e.g., the virtual quadrilateral E3E4E5E6) are located, and the four third virtual quadrilaterals are disposed around the second virtual quadrilateral E1E2F1F2. One side edge of the third virtual quadrilaterals is collinear with one side edge of the first virtual quadrilateral, and the midpoints of the four side edges of the first virtual quadrilateral are located on one of the side edges of the third virtual quadrilateral.

Exemplarily, the midpoints of a set of two opposite side edges (such as midpoint P5 and midpoint P6) in the first virtual quadrilateral are the vertexes of two third virtual quadrilaterals, respectively.

In some embodiments of the present application, referring to any one of FIG. 1 and FIG. 4-FIG. 11, each side edge of the first virtual quadrilateral Q1Q2Q3Q4 is provided with four first subpixels 1 and three second subpixels 2, and one of the first subpixels 1 and the second subpixels 2 located on each side of the first virtual quadrilateral are arranged at interval; and two side edges of the third virtual quadrilateral are collinear with two side edges of the first virtual quadrilateral, and a vertex of the third virtual quadrilateral and a vertex of the first virtual quadrilateral are common-vertex.

Figures 4, 5:
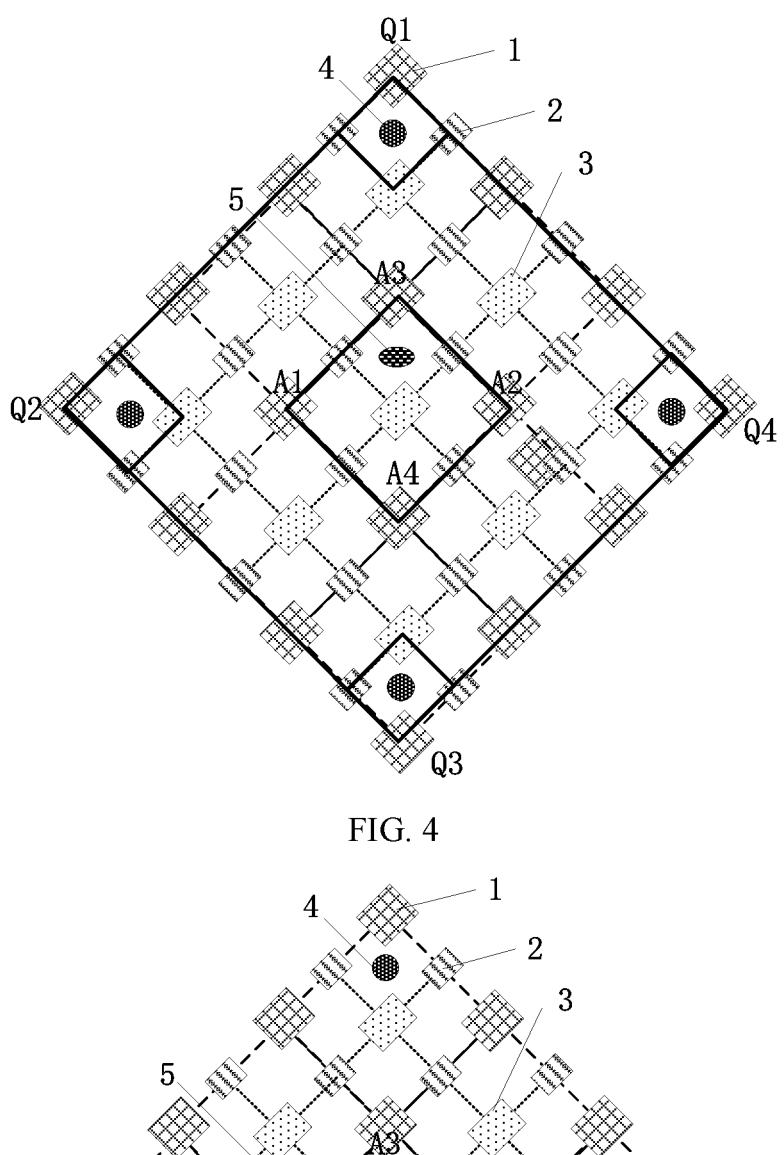
Figure 6:
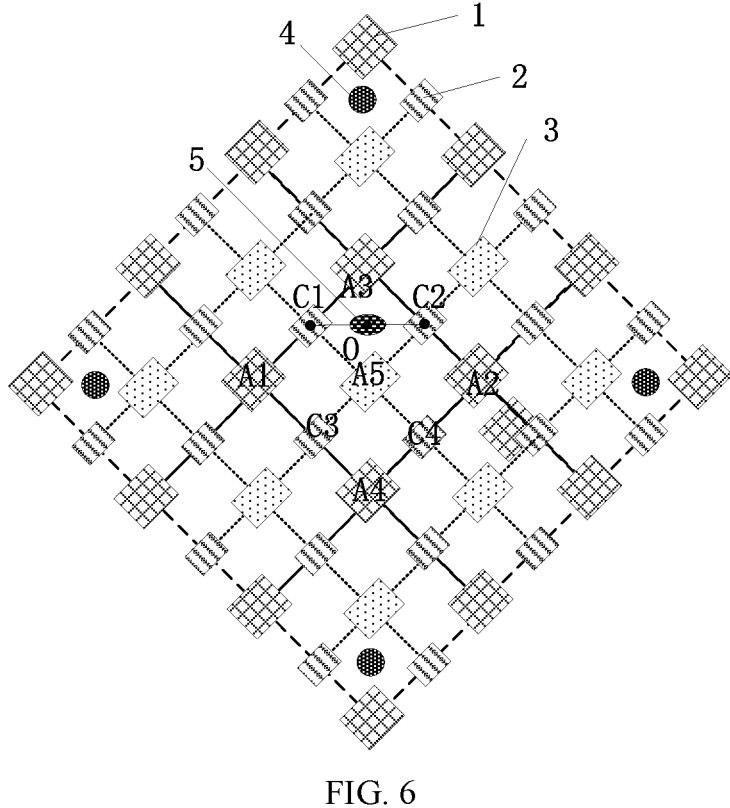
Figure 7:
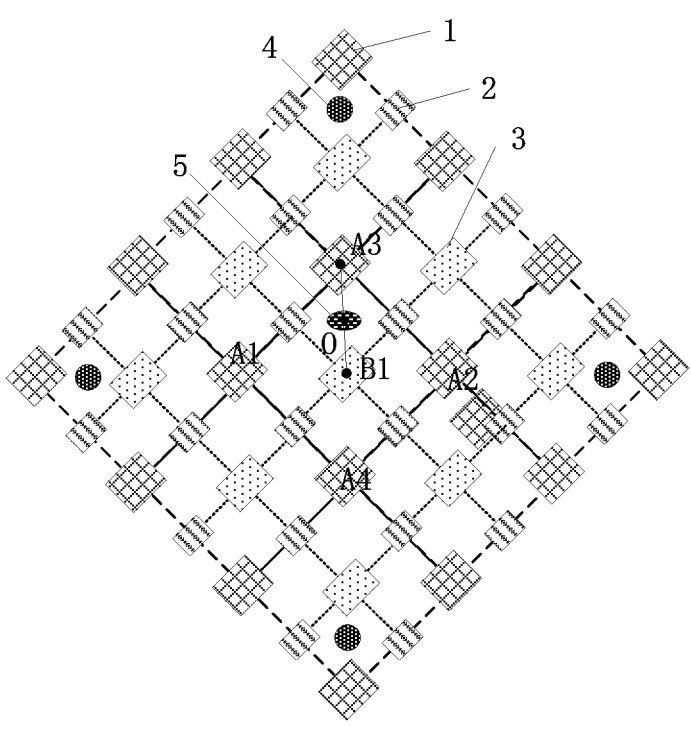
Figure 8:
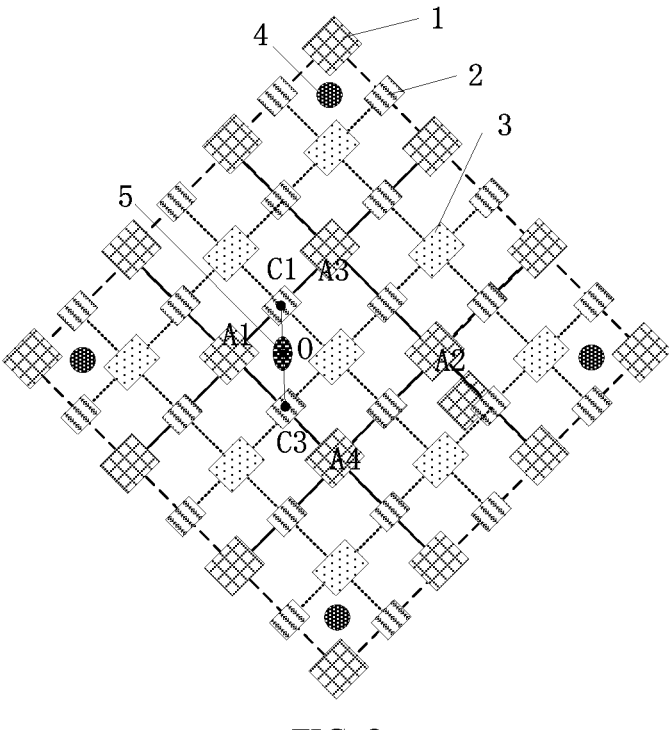
Figure 11:
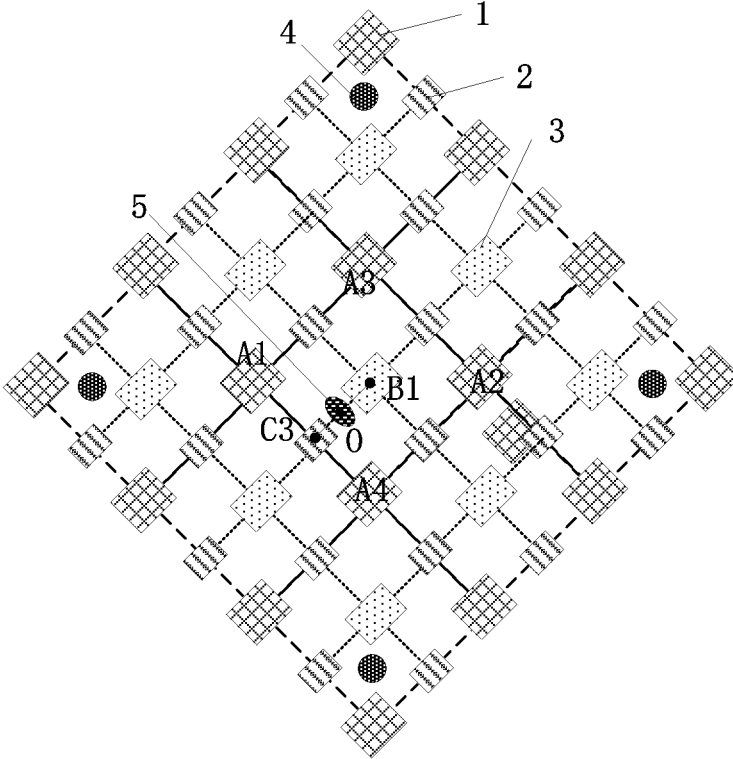

In some embodiments of the present application, referring to any one of FIG. 1 and FIG. 4 FIG. 11, four vertexes (such as vertex A1, A2, A3 or A4) of the second virtual quadrilateral are provided with the first subpixels 1, four side edges of the second virtual quadrilateral are provided with the second subpixels 2, and a geometric center of the second virtual quadrilateral is provided with one of the third subpixels 3; and the second subpixels 2 are arranged at a set of two opposite vertexes of the third virtual quadrilateral (such as Q2Q5Q6Q7), wherein one of the first subpixels 1 arranged at one vertex (such as Q1, Q2, Q3 or Q4) and the first virtual quadrilateral are common-vertex, one of the third subpixels 3 is arranged at the other vertex (such as the vertex opposite to Q1, Q2, Q3 or Q4 in the third virtual quadrilateral).

In an exemplary embodiment, one of the second subpixels 2 may be located at the midpoints of four side edges of the second virtual quadrilateral.

In some embodiments of the present application, referring to FIG. 2, FIG. 12, FIG. 13 or FIG. 14, one set of two opposite side edges (such as side edge S1S3 and side edge S2S4) of the first virtual quadrilateral S1S2S3S4 is provided with five first subpixels 1, the other set of two opposite side edges (such as side edge S1S2 and side edge S3S4) of the first virtual quadrilateral is provided with four first subpixels 1, and the two side edges (such as side edge S1S2 and side edge S3S4) provided with four first subpixels 1 partially overlap with outer contours of three third subpixels 3, respectively; and each of the third virtual quadrilateral is a virtual trapezoid, and a lower bottom edge (such as side edge S3S7) of the virtual trapezoid is collinear with one side edge of the first virtual quadrilateral, a vertex (such as S3) on the lower bottom edge of the virtual trapezoid and a vertex of the first virtual quadrilateral are common-vertex.

In some embodiments of the present application, referring to FIG. 2, FIG. 12, FIG. 13 or FIG. 14, the first subpixels 1 are arranged at one set of two opposite vertexes of the second virtual quadrilateral S5S6M1M2, one of the second subpixels 2 and one of the third subpixels 3 are arranged at the other set of two opposite vertexes of the second virtual quadrilateral S5S6M1M2; and the first subpixels 1 are arranged at the two vertexes on the lower bottom edge of the virtual trapezoid, and one of the second subpixels 2 and one of the third subpixels 3 are arranged at the two vertexes on an upper bottom edge of the virtual trapezoid.

In an exemplary embodiment, the upper bottom edge and the lower bottom edge of the virtual trapezoid are parallel, and the upper bottom edge is a bottom edge with a shorter length and the lower bottom edge is a bottom edge with a longer length.

In some embodiments of the present application, referring to any one of FIG. 3 and FIG. 15-FIG. 20, six first subpixels 1 are arranged at one set of two opposite side edges (such as side edge P1P3 or side edge P2P4) of the first virtual quadrilateral P1P2P3P4, and seven first subpixels 1 are arranged at the other set of two opposite side edges (such as side edge P1P2 or side edge P3P4) of the first virtual quadrilateral P1P2P3P4; and one side edge (such as E5E6) of the third virtual quadrilateral (such as E3E4E5E6) is collinear with one side edge (such as P1P2) of the first virtual quadrilateral, and midpoints of the four side edges of the first virtual quadrilateral are located on one side edge of the third virtual quadrilateral.

Exemplarily, referring to FIG. 3, for the third virtual quadrilateral including the vertex P5 and the third virtual quadrilateral including the vertex P6, the geometric centers of the first virtual quadrilateral is the symmetric point of the third virtual quadrilateral and the third virtual quadrilateral which are symmetrically distributed. In addition, the vertex P5 is the midpoint of the side edge P2P4 of the first virtual quadrilateral, and the vertex P6 is the midpoint of side edge P1P3 of the first virtual quadrilateral. For the other two third virtual quadrilaterals, they are mirror symmetrically distributed with the line segment P5P6 as the symmetry axis.

In some embodiments of the present application, referring to any one of FIG. 3 and FIG. 15-FIG. 20, the first subpixels 1 are arranged at one set of two opposite vertexes of the second virtual quadrilateral ETE2F1F2, and one of the second subpixels 2 and one of the third subpixels 3 are arranged at the other set of two opposite vertexes of the second virtual quadrilateral ETE2F1F2, and one of the second subpixels 2 includes two subpixel parts 21 and 22; luminescent areas of the subpixel part 21 and the subpixel part 22 are not connected to each other; and the first subpixels 1 are arranged at four vertexes of the third virtual quadrilateral (E3E4E5E6), and one second subpixel 2 and one third subpixel 3 are arranged inside the third virtual quadrilateral.

In an exemplary embodiment, the meaning that luminescent areas of the subpixel part 21 and the subpixel part 22 are not connected to each other is: since each subpixel (or subpixel part) includes an anode, a luminescent layer, and a cathode, for the two subpixel parts in one of the second subpixels 2, the anodes are not connected to each other, so that the actual luminescent areas are not connected to each other.

The luminescent layers of the two subpixels in one of the second subpixels 2 may be disconnected, or the luminescent layers of the two subpixels in one of the second subpixels 2 may be connected, which may be determined according to the actual process conditions, which does not affect that the luminescent areas of subpixel part 21 and subpixel part 22 are not connected to each other.

In an exemplary embodiment, the luminescent area of the subpixel part 21 and the luminescent area of the subpixel part 22 may be disposed mirror symmetrically.

In some embodiments of the present application, referring to FIG. 1 and FIG. 4-FIG. 11, an outer contour of an area where the main spacer 5 is located is located within an outer contour of the second virtual quadrilateral A1A2A3A4.

It can be understood that the outer contour of an area where the main spacer 5 is located is located within the outer contour of the second virtual quadrilateral A1A2A3A4, and does not overlap with the area where one of the third subpixels inside the second virtual quadrilateral A1A2A3A4.

In an exemplary embodiment, referring to FIG. 1 and FIG. 4-FIG. 11, a shape of an orthographic projection of one of the first subpixels 1 on the substrate, a shape of an orthographic projection of one of the second subpixels 2 on the substrate and a shape of an orthographic projection of one of the third subpixels 3 on the substrate are quadrilaterals, such as rhombuses or rectangles. And an area of the orthographic projection of one of the first subpixels 1 on the substrate is greater than an area of the orthographic projection of one of the third subpixels 3 on the substrate, and the area of the orthographic projection of one of the third subpixels 3 on the substrate is greater than an area of the orthographic projection of one of the second subpixels 2 on the substrate In an exemplary embodiment, referring to FIG. 1 and FIG. 4-FIG. 11, a plurality of first subpixel 1 and a plurality of second subpixel 2 are located in the same row, and one of the first subpixels 1 and one of the second subpixels 2 in the same row are arranged at interval.

In an exemplary embodiment, referring to FIG. 1 and FIG. 4-FIG. 11, the plurality of second subpixel 2 and a plurality of third subpixel 3 are located in the same row, and one of the second subpixels 2 and one of the third subpixels 3 in the same row are arranged at interval.

In an exemplary embodiment, referring to FIG. 1 and FIG. 4-FIG. 11, the plurality of third subpixel 3 and the plurality of first subpixel 1 are located in the same row, and one of the third subpixels 3 and one of the first subpixels 1 in the same row are arranged at interval.

Here, the specific position and arrangement of the main spacer 5 in the second virtual quadrilateral A1A2A3A4 are not limited.

Exemplarily, the main spacer 5 may be located at any one of positions surrounding the area of one of the third subpixels 3 in the second virtual quadrilateral A1A2A3A4.

Exemplarily, referring to FIG. 1 and FIG. 4-FIG. 9, the main spacer 5 may be located between one of the first subpixels 1 and one of the third subpixels 3.

Figure 10:
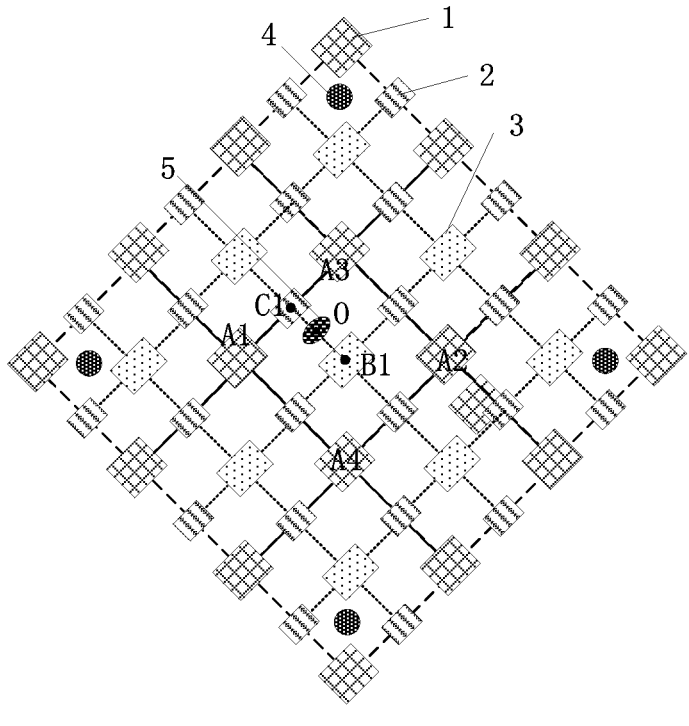

Exemplarily, referring to FIG. 10 and FIG. 11, the main spacer 5 may be located between one of the second subpixels 2 and one of the third subpixels 3.

In the embodiments of the present application, by arranging that the outer contour of the area where the main spacer 5 is located is located within the outer contour of the second virtual quadrilateral A1A2A3A4, since the second virtual quadrilateral is located in the central area of the first virtual quadrilateral, the auxiliary spacers 4 is disposed around the second virtual quadrilateral, so that under the interaction between the main spacer 5 and the auxiliary spacer 4 around the main spacer 5, the support force distribution uniformity of the group of spacers to the FMM mask is high, which avoids the FMM mask to scratch the individual spacers in the group of spacers caused by the support imbalance, and improves the production yield of the display base plate, avoids the problem of small gray points caused by scratches during preparing the display apparatus by using the display base plate and improves the display effect of the display apparatus.

In some embodiments of the present application, referring to FIG. 1 and FIG. 4-FIG. 9, the main spacer 5 is located between one of the first subpixels 1 and one of the third subpixels 3.

Here, the placing direction of the main spacer 5 between one of the first subpixels 1 and one of the third subpixels 3 (or the main spacer 5 between one of the second subpixels 2 and one of the third subpixels 3) is not limited.

When the maximum size and the minimum size of the orthographic projection of the main spacer 5 on the substrate are different, an extending direction of the maximum size of the orthographic projection of the main spacer 5 on the substrate is the placing direction of the main spacer 5. For example, when the shape of the orthographic projection of the main spacer 5 on the substrate is ellipse, an extending direction of the long axis of the ellipse is the placing direction of the main spacer 5.

Exemplarily, referring to FIG. 1, FIG. 4, FIG. 6, FIG. 7 and FIG. 8, the placing direction of the main spacer 5 intersects the direction of one of the first subpixels 1 pointing to one of the third subpixels 3 in the same fourth virtual quadrilateral. For example, the placing direction of the main spacer 5 is perpendicular to the direction of one of the first subpixels 1 pointing to one of the third subpixels 3 in the same fourth virtual quadrilateral.

Figure 9:
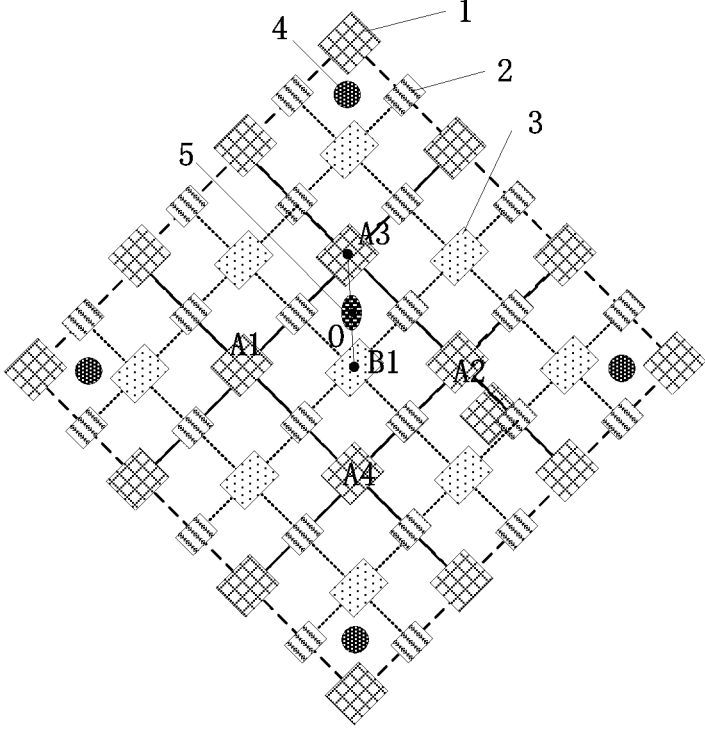

Exemplarily, referring to FIG. 5 and FIG. 9, the placing direction of the main spacer 5 is the same as the direction of one of the first subpixels 1 pointing to one of the third subpixels 3 in the same fourth virtual quadrilateral. At this time, the orthographic projection of the geometric center of the main spacer 5 on the substrate, the orthographic projections of the center of first subpixel 1 and the center of third subpixel 3 on the substrate may also be arranged in a straight line.

It should be noted that the center of first subpixel 1 may be its geometric center, or the center of one of the first subpixels 1 may also be its luminescent center; the meaning of the center of one of the third subpixels 3 is similar to the center of one of the first subpixels 1, which is not repeated.

Exemplarily, referring to FIG. 10 and FIG. 11, when the main spacer 5 is located between one of the second subpixels 2 and one of the third subpixels 3, the placing direction of the main spacer 5 intersects the direction of one of the second subpixels 2 pointing to one of the third subpixels 3 in the same fourth virtual quadrilateral. For example, the placing direction of the main spacer 5 is perpendicular to the direction of one of the second subpixels 2 pointing to one of the third subpixels 3 in the same fourth virtual quadrilateral.

In some embodiments of the present application, referring to FIG. 1, FIG. 4, FIG. 6, FIG. 7 and FIG. 8, a maximum size of an orthographic projection of the main spacer 5 on the substrate along a first direction is regarded as a first size, and a maximum size of the orthographic projection of the main spacer 5 on the substrate along a second direction is regarded as a second size;

wherein the first size is less than or equal to the second size; the first direction is a direction of one of the first subpixels 1 pointing to one of the third subpixels 3 in the fourth virtual quadrilateral, and the second direction is a direction of one second subpixel 2 pointing to the other second subpixel 2 in the fourth virtual quadrilateral; four fourth virtual quadrilaterals form a second virtual quadrilateral.

In an exemplary embodiment, the second virtual quadrilateral A1A2A3A4 consists of four fourth virtual quadrilaterals. Specifically, referring to FIG. 6, the second virtual quadrilateral A1A2A3A4 consists of the fourth virtual quadrilateral A1C1A5C3, the fourth virtual quadrilateral A5C3A4C4, the fourth virtual quadrilateral A5C4A2C2 and the fourth virtual quadrilateral A5C2A3C1.

In an exemplary embodiment, the four vertexes of the fourth virtual quadrilateral are respectively provided with a set of one of the first subpixels 1 and one of the third subpixels 3 which are opposite, and a set of two opposite second subpixels 2.

In an exemplary embodiment, the first size may be set to be less than the second size, wherein the first direction is the direction of one of the first subpixels 1 pointing to one of the third subpixels 3 in the fourth virtual quadrilateral, and the second direction is the direction of one second subpixel 2 pointing to the other second subpixel 2 in the fourth virtual quadrilateral.

It should be noted that when the first size is less than or equal to the second size, the first direction is the placing direction of the main spacer 5.

In some embodiments of the present application, referring to FIG. 1, the shape of the orthographic projection of the main spacer on the substrate is an ellipse, and a long axis direction of the ellipse is consistent with the second direction (in the same fourth virtual quadrilateral, one second subpixel 2 points to the other second subpixel 2).

In the embodiments of the present application, by arranging that the placing direction of the main spacer 5 (e.g., the extending direction of the long axis of the elliptical main spacer 5) is the direction that one second subpixel 2 pointing to the other second subpixel 2 in the same fourth virtual quadrilateral, the first size is less than or equal to the second size. The maximum size of the orthographic projection of the main spacer 5 on the substrate along the first direction is the first size, and the maximum size of the orthographic projection of the main spacer 5 on the substrate along the second direction is the second size.

In the preparing process, since the second size (larger than the first size) is the larger size of the main spacer, even if there is a shift in the center position of the main spacer 5 caused by the unstable process, the probability of further narrowing the distance between the main spacer 5 and one of the third subpixels 3 is small, thus reducing the probability of the main spacer 5 approaching one of the third subpixels 3, which reduces the probability of the display base plate being scratched and improves the quality of the product.

It should be noted that in practical applications, the thickness of the luminescent function layer in third subpixel 3 is greater than the thickness of the luminescent function layer in first subpixel 1. When the thickness of the luminescent function layer in one of the third subpixels 3 is greater than the thickness of the luminescent function layer in one of the second subpixels 2, the smaller the distance between the main spacer 5 and one of the third subpixels 3, the greater the probability of the display base plate being scratched. Or, when the displaying light of one of the third subpixels 3 is red, the smaller the distance between the main spacer 5 and one of the third subpixels 3, the greater the probability of the display base plate being scratched.

In some embodiments of the present application, referring to FIG. 1, for one first virtual quadrilateral, a pattern formed by successively connecting geometric centers of auxiliary spacers 4 is a square.

In an exemplary embodiment, referring to FIG. 1, the auxiliary spacers 4 are located in the geometric center of the third virtual quadrilateral, so that the geometric centers of the auxiliary spacers 4 may be connected in turn to form a square, thereby improving the distribution uniformity of the main spacer 5 and the auxiliary spacers 4 in the same spacer, thus, improving the uniformity of the support force of the main spacer 5 and the auxiliary spacer 4 in the same spacer to the FMM mask, reducing the probability of the display base plate being scratched, and improving the yield of the product.

In some embodiments of the present application, referring to FIG. 2 or FIG. 3, the area where the main spacer 5 is located at least partially overlaps with the area where the second virtual quadrilateral is located.

In an exemplary embodiment, the meaning that the area where the main spacer 5 is located overlaps with the area where the outer contour of the second virtual quadrilateral is located at least partially is: referring FIG. 2 or FIG. 3, the area where the main spacer 5 is located overlaps with the area where the second virtual quadrilateral is located partially. Or, referring to FIG. 13, FIG. 14, FIG. 15, FIG. 17 and FIG. 18, the area where the main spacer 5 is located located within the area where the second virtual quadrilateral is located.

Exemplarily, referring to FIG. 2, FIG. 12, FIG. 13, and FIG. 14, the shape of the orthographic projection of one of the first subpixels 1 on the substrate, the shape of the orthographic projection of one of the second subpixels 2 on the substrate and the shape of the orthographic projection of one of the third subpixels 3 on the substrate are rectangular. The area of the orthographic projection area of one of the first subpixels 1 on the substrate is greater than the area of the orthographic projection area of one of the third subpixels 3 on the substrate. The area of the orthographic projection area of one of the third subpixels 3 on the substrate is greater than the area of the orthographic projection area of one of the second subpixels 2 on the substrate.

Exemplarily, referring to FIG. 2, FIG. 12, FIG. 13, and FIG. 14, the plurality of the first subpixels 1 are located in the same row.

Exemplarily, referring to FIG. 2, FIG. 12, FIG. 13 and FIG. 14, the plurality of second subpixels 2 and the plurality of third subpixels 3 are located in the same row, one of the second subpixels 2 and one of the third subpixels 3 in the same row are arranged at interval.

Figures 12, 13:
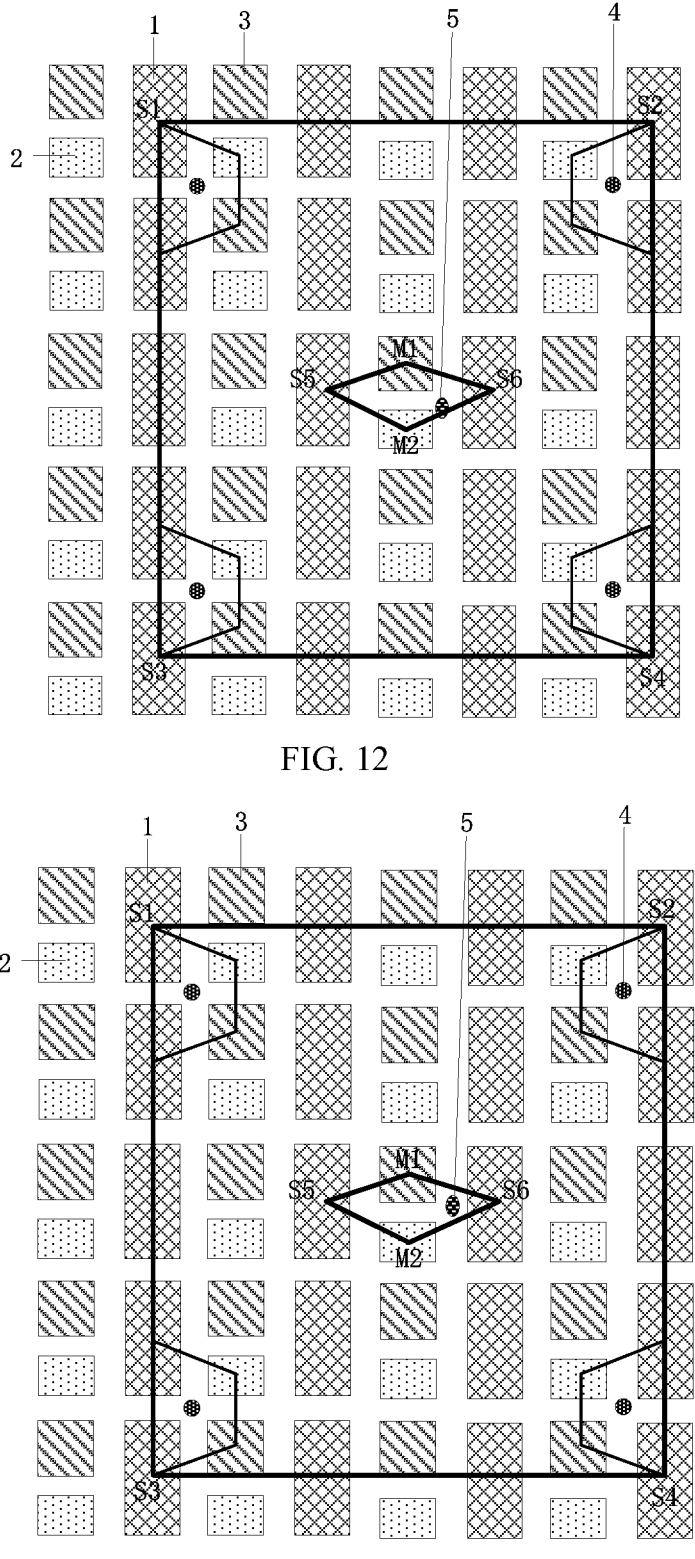
Figure 14:
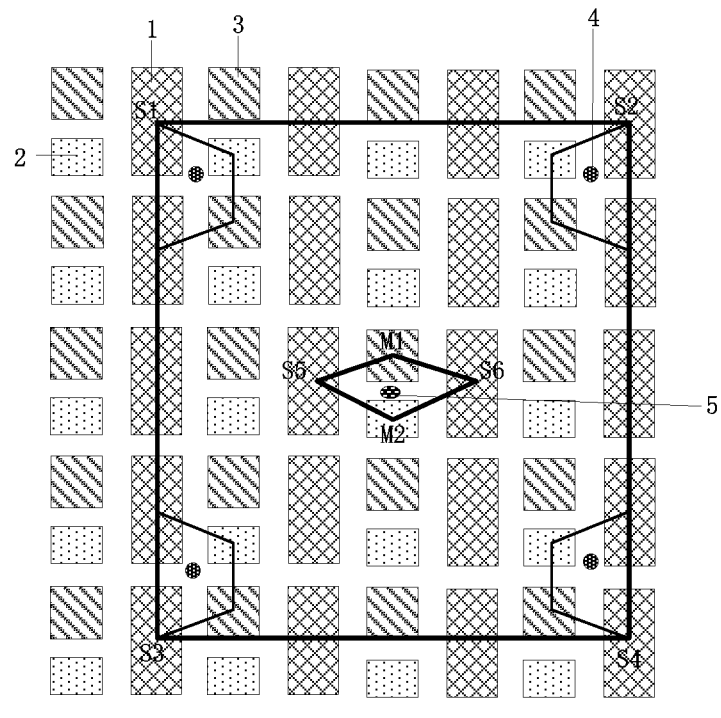

In an exemplary embodiment, referring to FIG. 2, FIG. 12 and FIG. 13, the area where the main spacer 5 is located at least partially overlaps with the area where the second virtual quadrilateral is located, and the main spacer 5 is located in the area surrounded by one of the first subpixels 1, one of the second subpixels 2 and one of the third subpixels 3, it can be understood that, at this time, the main spacer 5 is located among one of the first subpixels 1, one of the second subpixels 2 and one of the third subpixels 3.

Exemplarily, the main spacer 5 may be located between one of the first subpixels 1 and one of the second subpixels 2; or the main spacer 5 may be located between one of the first subpixels 1 and one of the third subpixels 3.

In an exemplary embodiment, the main spacer 5 may be located between one of the second subpixels 2 and one of the third subpixels 3.

In an exemplary embodiment, referring to FIG. 2, FIG. 12 and FIG. 13, the main spacer 5 may be located between one of the first subpixels 1 and one of the second subpixels 2.

Exemplarily, referring to FIG. 2, FIG. 12 and FIG. 13, the minimum distance between the main spacer 5 and one of the first subpixels 1 is less than the minimum distance between the main spacer 5 and one of the third subpixels 3, and the minimum distance between the main spacer 5 and one of the second subpixels 2 is less than the minimum distance between the main spacer 5 and one of the third subpixels 3. Understandably, at this time, the main spacer 5 is closer to one of the first subpixels 1 and one of the second subpixels 2, and farther away from one of the third subpixels 3.

In an exemplary embodiment, referring to FIG. 3 and FIG. 15-FIG. 20, the same one first subpixel 1 is located in the same row, the same one second subpixel 2 is located in the same row, and the same one third subpixel 3 is located in the same row.

In an exemplary embodiment, referring to FIG. 3 and FIG. 15-FIG. 20, the shape of the orthographic projection of one of the first subpixels 1 on the substrate and the shape of the orthographic projection of one of the third subpixels 3 on the substrate are both rod-shaped, one of the second subpixels 2 includes two subpixel parts which are mirror symmetrically arranged and are not connected to each other, the shape of the orthographic projection of one of the second subpixels 2 on the substrate is a shape formed by a rectangular and a sector.

In an exemplary embodiment, the area where the main spacer 5 is located at least partially overlaps with the area where the second virtual quadrilateral F1E2F2E1 is located.

Figure 15:
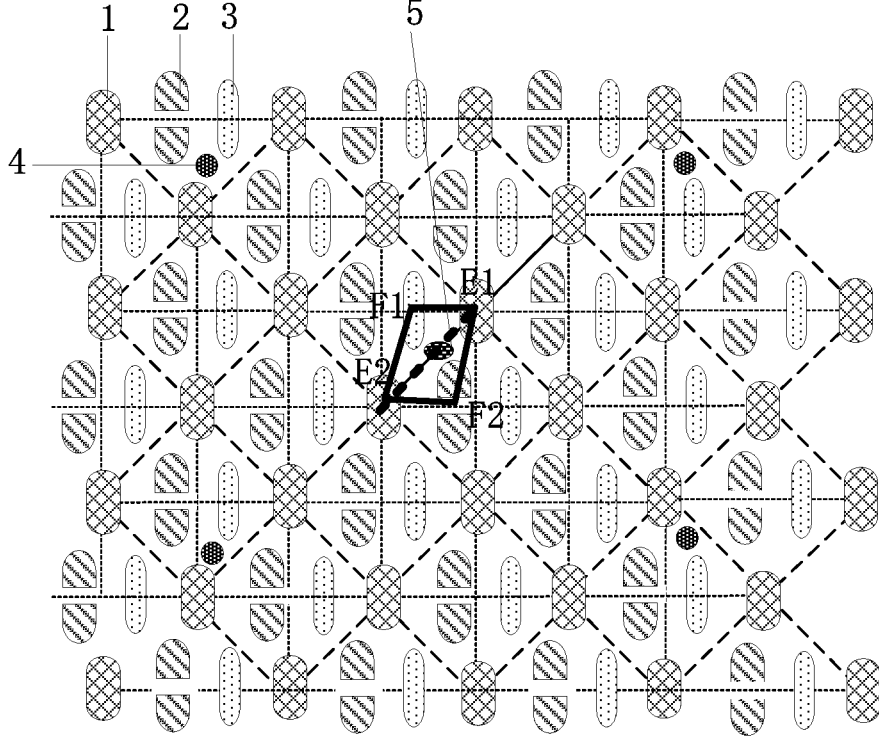
Figure 16:
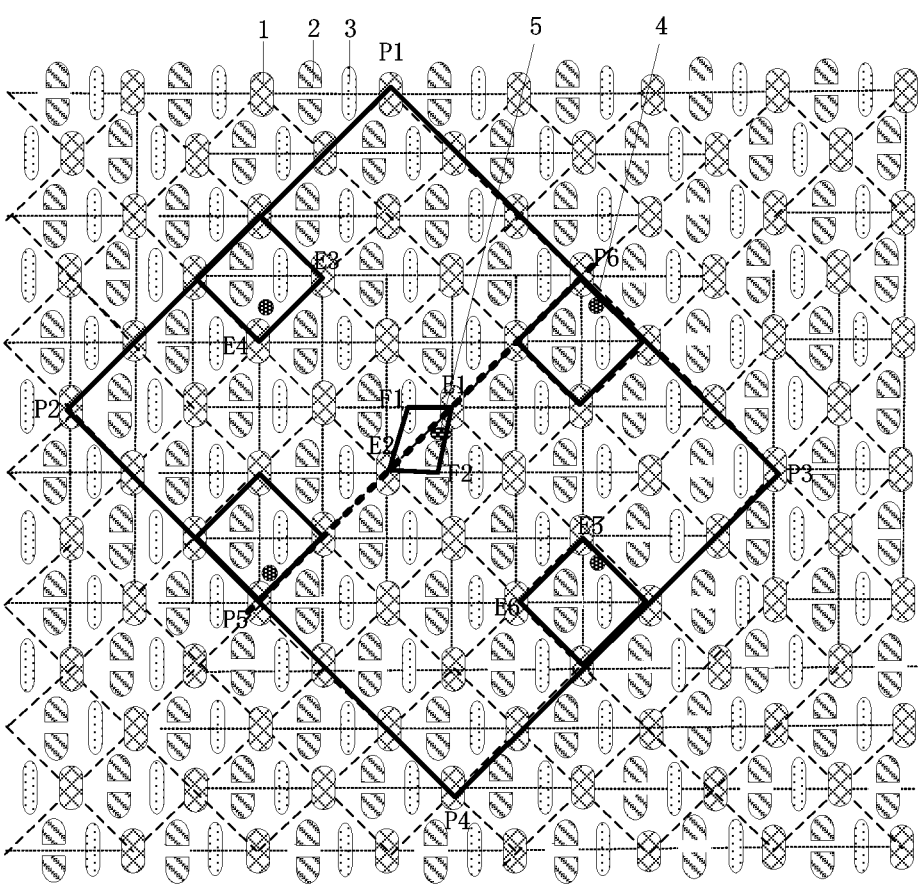
Figure 17:
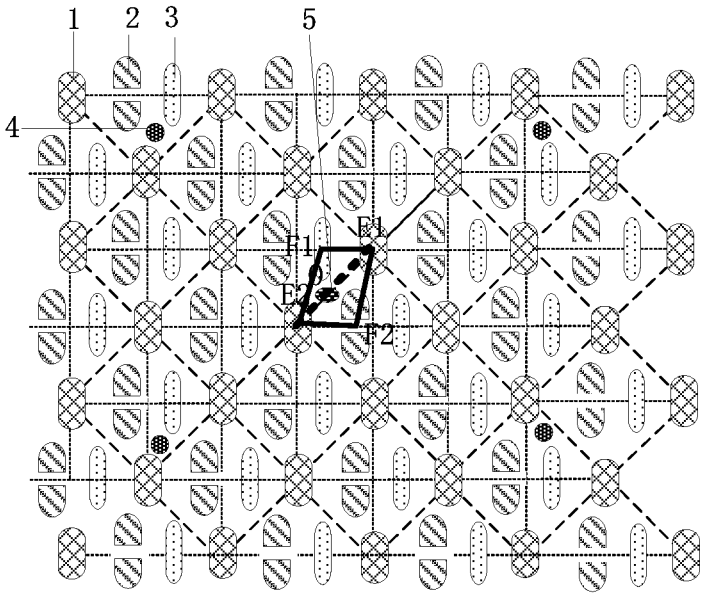
Figure 18:
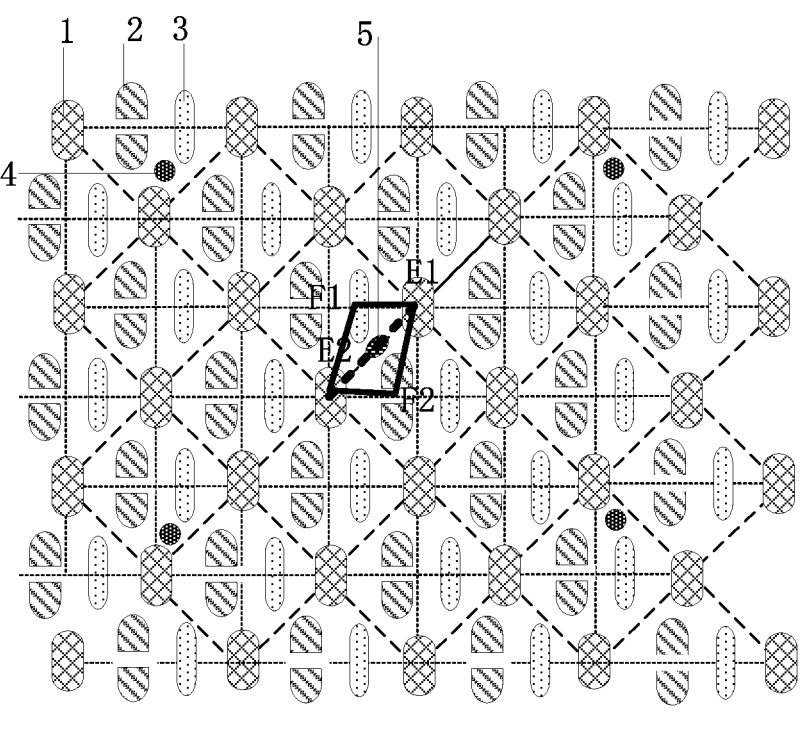

Exemplarily, referring to FIG. 15, FIG. 17, and FIG. 18, where the main spacer 5 is located between one of the second subpixels 2 and one of the third subpixels 3.

In FIG. 18, in order to reduce the probability of the main spacer being scratched, the direction of the maximum size of the shape of the orthographic projection of the main spacer 5 on the substrate (for example, the long axis direction of the ellipse) is set to be consistent with the direction of one first subpixel 1 pointing to the other subpixel 1 in the same second virtual quadrilateral.

Exemplarily, referring to FIG. 3, FIG. 16, FIG. 19, and FIG. 20, the main spacer 5 is located between one of the first subpixels 1 and one of the second subpixels 2.

Figure 19:
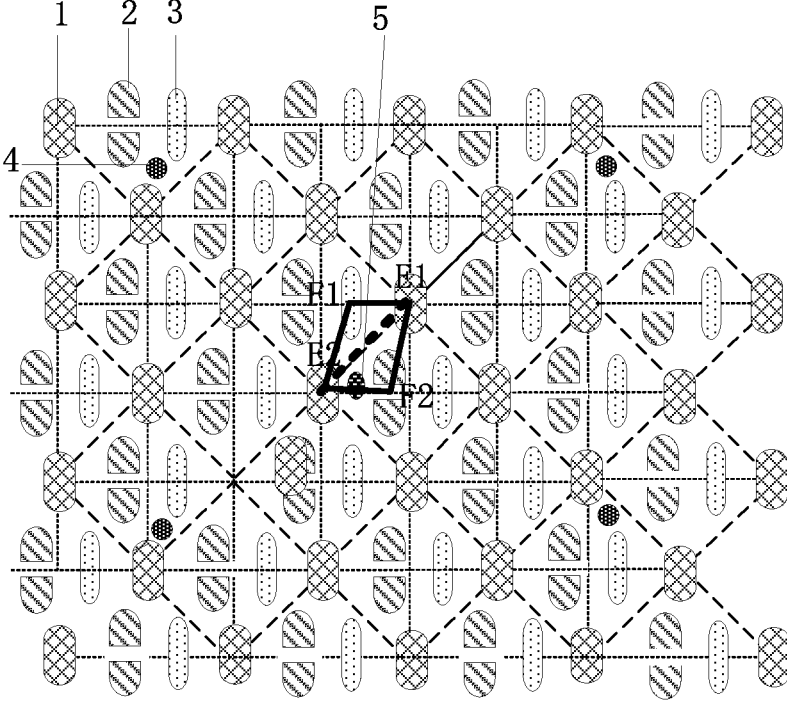
Figure 20:
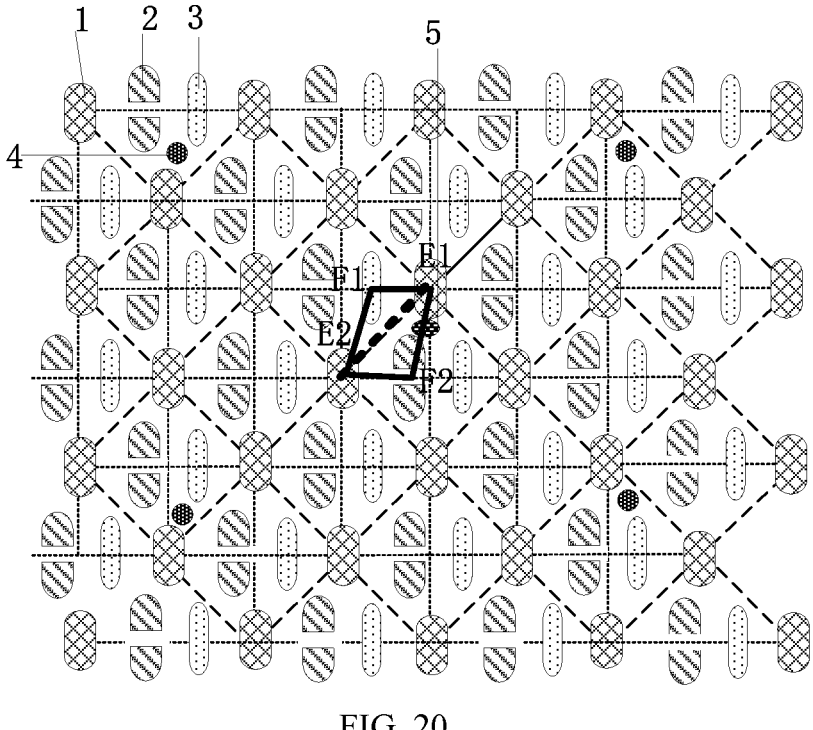

Exemplarily, referring to FIG. 19, the geometric center of the main spacer 5, and the geometric center of one of the first subpixels 1 and the geometric center of one of the second subpixels 2 in the same second virtual quadrilateral may be arranged in the same line, since one of the second subpixels 2 includes two subpixel parts which are mirror symmetrically arranged and are not connected to each other. The geometric center of one of the second subpixels 2 is located between two subpixel parts, and the main spacer 5 is arranged here. In the preparing process of the display base plate, the main spacer 5 may have a lower scratch probability and allow the main spacer 5 to have a larger process fluctuation space, thereby improving the quality and yield of the display base plate.

In some embodiments of the present application, for the display base plate such as FIG. 2 or FIG. 3, the main spacer 5 is disposed between one of the first subpixels 1 and one of the second subpixels 2.

In the embodiments of the present application, by arranging the main spacer 5 between one of the first subpixels 1 and one of the second subpixels 2, the main spacer 4 is away from one of the third subpixels 3, thereby reducing the probability that the display base plate is scratched by the FMM mask and improving the production yield of the display base plate, and improving the display effect of the display apparatus prepared by the display base plate.

In some embodiments of the present application, referring to FIG. 2 or FIG. 3, for one first virtual quadrilateral, a distance difference between geometric centers of the auxiliary spacers 4 and a geometric center of the main spacer 5 are less than or equal to a maximum size of a pixel unit, the pixel unit includes one of the first subpixels 1, one of the second subpixels 2 and one of the third subpixels 3.

In an exemplary embodiment, distances from the geometric centers of the auxiliary spacers 4 to the geometric center of the main spacer 5 are equal.

In an exemplary embodiment, referring to FIG. 2, the geometric centers of the auxiliary spacers 4 is connected in turn to form a rectangle.

In the embodiments of the present application, by arranging that the distance difference between geometric centers of the auxiliary spacers 4 and the geometric center of the main spacer 5 are less than or equal to the maximum size of the pixel unit, at this way, the distance between the auxiliary spacers 4 and the main spacer 5 in the same one group of spacers is controlled as equal as possible. Therefore, the support force received by the auxiliary spacers 4 and the main spacer 5 in the same one group of spacers tends to be equal, which improves the stress uniformity of the auxiliary spacers 4 and the main spacer 5 in the same one group of spacers, reduces the probability of spacer being crushed or scratched, and improves the quality of the display base plate.

In some embodiments of the present application, for any one of the display base plates shown in FIG. 1, FIG. 2 or FIG. 3, for one second virtual quadrilateral, a minimum distance between the main spacer 5 and one of the first subpixels 1 is less than a minimum distance between the main spacer 5 and one of the third subpixels 3, and a minimum distance between the main spacer 5 and one of the second subpixels 2 is less than the minimum distance between the main spacer 5 and the third subpixel.

In an exemplary embodiment, for one third virtual quadrilateral, the minimum distance between the auxiliary spacer 4 and one of the first subpixels 1 is less than the minimum distance between the auxiliary spacer 4 and one of the third subpixels 3, and the minimum distance between the auxiliary spacer 4 and one of the second subpixels 2 is less than the minimum distance between the auxiliary spacer 4 and the third subpixel.

In the embodiments of the present application, the main spacer 5 and the auxiliary spacers 4 are disposed away from one of the third subpixels 3, which may reduce the probability of the spacer being scratched. The thickness of the luminescent function layer of one of the third subpixels 3 is greater than the thickness of the luminescent function layer of one of the first subpixels 1, and the thickness of the luminescent function layer of one of the third subpixels 3 is greater than the thickness of the luminescent function layer of one of the second subpixels 2. Or, one of the third subpixels 3 is a red subpixel.

Figure 21:
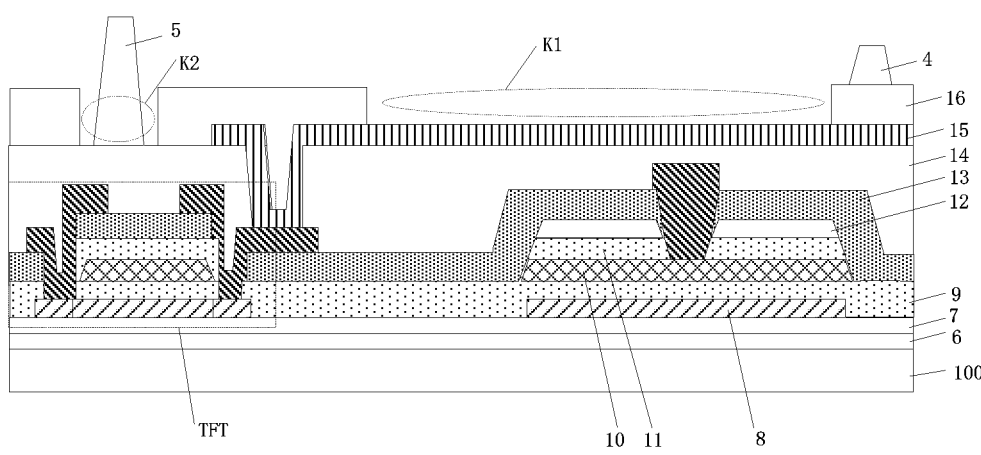
FIG. 21 to FIG. 23 are schematic structural diagrams showing the cross-sections of three display base plates according to the embodiments of the present application.

In some embodiments of the present application, for any one of the display base plates shown in FIG. 1, FIG. 2 or FIG. 3, referring to FIG. 21, the display base plate includes a pixel-defining layer 16 located on the substrate 100, and the pixel-defining layer 16 has a plurality of openings K1 arranged in an array, and subpixels are at least located in the openings K1.

The pixel-defining layer 16 further includes a plurality of recesses K2 arranged in an array, a number of the recesses K2 is greater than or equal to a number of the main spacers 5, and the main spacer 5 is located in the recesses K2, an outer contour of an orthographic projection of the main spacer 5 on the substrate 100 is located within outer contours of orthographic projections of the recesses K2 on the substrate 100.

In an exemplary embodiment, the number of the recesses K2 may be greater than the number of the main spacers 5, or the number of the recesses K2 may be equal to the number of the main spacers 5.

It should be noted that the number of the recesses K2 may be greater than the number of the main spacers 5 refers to: the number of recesses K2 used for arranging the main spacer 5 may be greater than the number of the main spacers 5. That the number of the recesses K2 may be equal to the number of the main spacers 5 refers to: the number of recesses K2 used for configuring the main spacer 5 may be equal to the number of the main spacers 5. Here, the recesses K2 refers to the recesses used for arranging the main spacer 5, and it is not excluded that there are other recesses in the pixel-defining layer of the display base plate, for example, the recesses for outgas.

In an exemplary embodiment, the depth of the recess K2 along the direction perpendicular to the substrate 100 is less than or equal to the thickness of the pixel-defining layer 16 along the direction perpendicular to the substrate 100.

Figure 22:
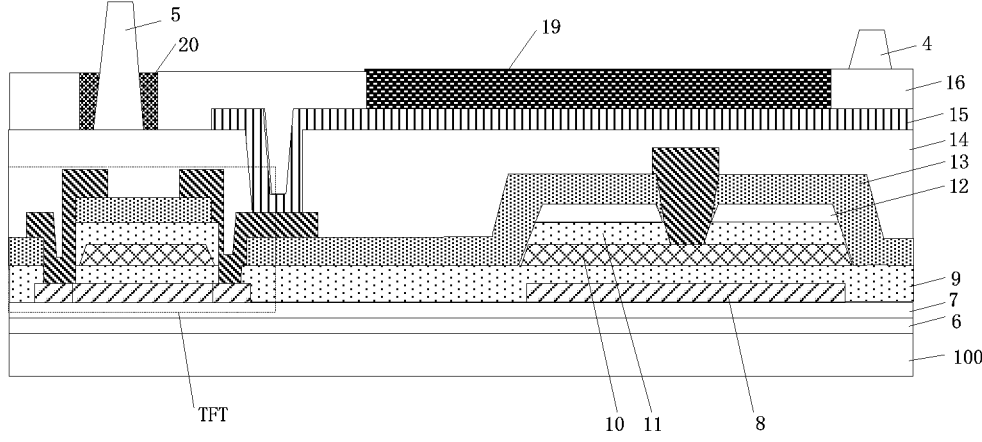
Figure 23:
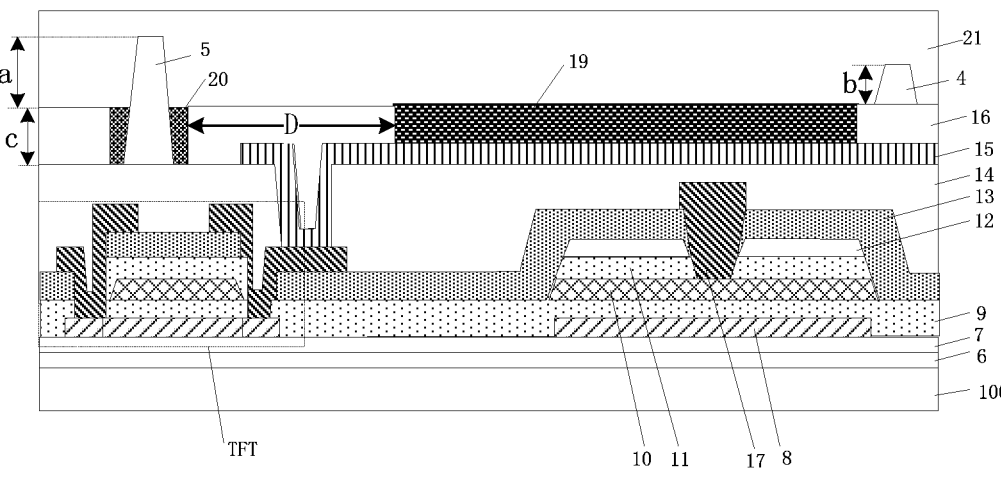

In some embodiments of the present application, referring to FIG. 22 and FIG. 23, the display base plate further includes an encapsulating layer and 21 a covering layer 20, the covering layer 20 at least fills an area of the recesses K2 where no main spacer 5 is arranged and the encapsulating layer 21 covers the pixel-defining layer 16, the subpixel (including the luminescent function layer 19) and the covering layer 20.

Here, the specific material of the covering layer 20 is not limited. Exemplarily, a material of the covering layer 20 may be an organic material, such as a resin.

In an exemplary embodiment, the meaning that the covering layer 20 at least fills an area of the recesses K2 where no main spacer 5 is arranged is: referring to FIG. 22, the covering layer 20 fills an area of the recesses K2 where no main spacer 5 is arranged; or, the covering layer 20 not only fills the area of the recesses K2 where no main spacer 5 is arranged, but also extends to the surface of the pixel-defining layer 16 away from the substrate 100.

In the embodiments of the present application, by arranging the main spacer 5 in the recesses K2 to prepare the subpixel (including luminescent function layer and cathode), when the main spacer 5 is crushed or scratched by the FMM mask, the debris of the main spacer 5 falls into 2 recesses K2, which avoids the debris of the main spacer 5 falling into the luminescent area of the subpixel. So as to avoid causing the abnormal displaying of the display base plate. In addition, before the preparing of the encapsulation layer 21, the covering layer 20 fills the area of the recesses K2 where no main spacer 5 is arranged, so as to avoid the secondary damage to the display base plate caused by the overflow of debris in the subsequent process steps.

It should be noted that, in practical applications, the encapsulation layer 21 includes an inorganic layer, an organic layer and an inorganic layer arranged in layer configuration on the pixel-defining layer 16. Due to the poor encapsulation of the inorganic layer to foreign matter and debris and the thin inorganic layer, debris or foreign matter may easily cause stress concentration and poor film formation of an inorganic layer close to the substrate 100, thus affecting the encapsulation effect of the encapsulation layer 21. The display base plate provided in the embodiment of the present application, by the covering layer 20 to cover the debris, which avoids the poor film formation of the encapsulation layer 21, so as to be able to assist to improve the encapsulation effect and improve the service life of the display base plate.

In some embodiments of the present application, referring to FIG. 23, a minimum distance D between the recess K2 along a direction parallel to a plane where the substrate 100 is located and neighboring opening K1 is greater than or equal to 1.35 µm.

In some embodiments of the present application, one of the first subpixels 1 includes a blue luminescent function layer, one of the second subpixels 2 includes a green luminescent function layer, and one of the third subpixels 3 includes a red luminescent function layer.

In an exemplary embodiment, referring to FIG. 23, the thickness c of the pixel-defining layer 16 ranges from 0.6 µm to 1.4 µm; the height b of the auxiliary spacer 4 ranges from 1.0 µm to 1.5 µm; the distance a from the surface of the main spacer 5 away from the substrate 100 to the surface of the pixel-defining layer 10 away from substrate 100 ranges from 1.8 µm to 2.6 µm.

In an exemplary embodiment, referring to FIG. 23, the display base plate further includes an organic layer 6, a buffer layer 7, an active layer 8, a first grid insulating layer 9, a grid layer 10, a second grid insulating layer 11, a conducting layer 12, a dielectric layer 13, a source and drain metal layer 17, a flat layer 14, an anode 15, a transistor TFT. Of course, the display base plate further includes other structures and film layers. Other structures and film layers included in the display base plate may refer to related art, which are not be repeated here.

The embodiments of the present application provide a display apparatus, including the display base plate stated above.

In the display apparatus provided in the embodiments of the present application, there are the main spacer 5 and the auxiliary spacer 4 in the area where the same one first virtual polygon is located, and the area where the main spacer 5 is located is located at the central area of the first virtual polygon, which greatly enhances the support of the group of spacers to the FMM mask in the local area. In addition, a plurality of the auxiliary spacers are disposed around the main spacer 5, so that the plurality of the auxiliary spacers can assist the main spacer 5 to support the FMM mask from different angles, improve the uniformity of the pressure on the main spacer 5, and avoid the scratch problem of caused by large pressure and uneven pressure on the main spacer 5, thereby avoiding the problem of poor display effect due to spacer being scratched and improving the display effect of the display apparatus prepared by the display base plate.

The display apparatus may be a displaying device such as an OLED displayer and any product or component with displaying function such as a television, a digital camera, a mobile phone, a tablet computer, etc.

The above are merely particular embodiments of the present application, and the protection scope of the present application is not limited thereto. All of the variations or substitutions that a person skilled in the art can easily envisage within the technical scope disclosed by the present application should fall within the protection scope of the present application. Therefore, the protection scope of the present application should be subject to the protection scope of the claims.

The invention claimed is:

1. A display base plate, comprising a substrate and first subpixels, second subpixels, third subpixels and a group of spacers which are located on the substrate;

the first subpixels are at least located at vertexes of a first virtual polygon, the second subpixels are at least located inside the first virtual polygon, and the third subpixels are located inside the first virtual polygon;

and the group of spacers is disposed inside the first virtual polygon, and the group of spacers comprises at least one main spacer and a plurality of auxiliary spacers;

wherein the main spacer and a second virtual quadrilateral at least partially overlap, and the second virtual quadrilateral is located in a central area of the first virtual polygon, and at least two vertexes of the second virtual quadrilateral are provided with the first subpixels; and the plurality of auxiliary spacers are located within the first virtual polygon and are disposed around the second virtual quadrilateral.

2. The display base plate according to claim 1, wherein the first virtual polygon is a first virtual quadrilateral, and the group of spacers comprises one main spacer and four auxiliary spacers; and an area where the auxiliary spacer is located overlaps with areas where third virtual quadrilaterals are located, and four third virtual quadrilaterals are disposed around the second virtual quadrilateral, and at least one side edge of the third virtual quadrilaterals is collinear with one side edge of the first virtual quadrilateral.

3. The display base plate according to claim 2, wherein each side edge of the first virtual quadrilateral is provided with four first subpixels and three second subpixels, and the first subpixels and the second subpixels located on each side of the first virtual quadrilateral are arranged at interval; and two side edges of the third virtual quadrilateral are collinear with two side edges of the first virtual quadrilateral, and a vertex of the third virtual quadrilateral and a vertex of the first virtual quadrilateral are common-vertex.

4. The display base plate according to claim 3, wherein four vertexes of the second virtual quadrilateral are provided with the first subpixels, four side edges of the second virtual quadrilateral are provided with the second subpixels, and a geometric center of the second virtual quadrilateral is provided with the third subpixel; and the second subpixels are provided at a set of two opposite vertexes of the third virtual quadrilateral, wherein one of the first subpixels is provided at one vertex shared with the first virtual quadrilateral, and one of the third subpixels is provided at the other vertex.

5. The display base plate according to claim 3, wherein an outer contour of the main spacer is located within an outer contour of the second virtual quadrilateral.

6. The display base plate according to claim 5, wherein the main spacer is located between one of the first subpixels and the third subpixel.

7. The display base plate according to claim 6, wherein a maximum size of an orthographic projection of the main spacer on the substrate along a first direction is regarded as a first size, and a maximum size of the orthographic projection of the main spacer on the substrate along a second direction is regarded as a second size;

wherein the first size is less than or equal to the second size; the first direction is a direction of one of the first subpixels pointing to one of the third subpixels in the fourth virtual quadrilateral, and the second direction is a direction of one second subpixel pointing to the other second subpixel in the fourth virtual quadrilateral; four fourth virtual quadrilaterals form a second virtual quadrilateral.

8. The display base plate according to claim 6, wherein for one second virtual quadrilateral, a minimum distance between the main spacer and one of the first subpixels is less than a minimum distance between the main spacer and the third subpixel, and a minimum distance between the main spacer and one of the second subpixels is less than the minimum distance between the main spacer and the third subpixel.

9. The display base plate according to claim 7, wherein the shape of the orthographic projection of the main spacer on the substrate is an ellipse, and a long axis direction of the ellipse is consistent with the second direction.

10. The display base plate according to claim 2, wherein one set of two opposite side edges of the first virtual quadrilateral is provided with five first subpixels, the other set of two opposite side edges of the first virtual quadrilateral is provided with four first subpixels, and the two side edges provided with four first subpixels partially overlap with outer contours of three third subpixels, respectively; and each of the third virtual quadrilateral is a virtual trapezoid, and a lower bottom edge of the virtual trapezoid is collinear with one side edge of the first virtual quadrilateral, a vertex on the lower bottom edge of the virtual trapezoid and a vertex of the first virtual quadrilateral are common-vertex.

11. The display base plate according to claim 10, wherein the first subpixels are provided at one set of two opposite vertexes of the second virtual quadrilateral, one of the second subpixels and one of the third subpixels are arranged at the other set of two opposite vertexes of the second virtual quadrilateral; and the first subpixels are arranged at the two vertexes on the lower bottom edge of the virtual trapezoid, and one of the second subpixels and one of the third subpixels are arranged at the two vertexes on an upper bottom edge of the virtual trapezoid.

12. The display base plate according to claim 2, wherein six first subpixels are arranged at one set of two opposite side edges of the first virtual quadrilateral, and seven first subpixels are arranged at the other set of two opposite side edges of the first virtual quadrilateral; and one side edge of the third virtual quadrilateral is collinear with one side edge of the first virtual quadrilateral, and midpoints of the four side edges of the first virtual quadrilateral are located on one side edge of the third virtual quadrilateral.

13. The display base plate according to claim 12, wherein the first subpixels are arranged at one set of two opposite vertexes of the second virtual quadrilateral, and one of the second subpixels and one of the third subpixels are arranged at the other set of two opposite vertexes of the second virtual quadrilateral, and one of the second subpixels comprises two subpixel parts; luminescent areas of the two subpixel parts are not connected to each other; and the first subpixels are arranged at four vertexes of the third virtual quadrilateral, and one second subpixel and one third subpixel are arranged inside the third virtual quadrilateral.

14. The display base plate according to claim 1, wherein the main spacer is located between one of the first subpixels and the second subpixel.

15. The display base plate according to claim 1, wherein for one first virtual quadrilateral, a distance difference between geometric centers of the auxiliary spacers and geometric centers of the main spacers are less than or equal to a maximum size of a pixel unit, the pixel unit comprises the first subpixel, one of the second subpixels and the third subpixel.

16. The display base plate according to claim 1, wherein the display base plate comprises a pixel-defining layer located on the substrate, and the pixel-defining layer includes a plurality of openings arranged in an array, and subpixels are at least located in the openings; and the pixel-defining layer further comprises a plurality of recesses arranged in an array, a number of the recesses is greater than or equal to a number of the main spacers, and the main spacer is located in the recesses, an outer contour of an orthographic projection of the main spacer on the substrate is located within outer contours of orthographic projections of the recesses on the substrate.

17. The display base plate according to claim 16, wherein the display base plate further comprises an encapsulating layer and a covering layer, the covering layer at least fills an area of the recesses where no main spacer is arranged; and the encapsulating layer covers the pixel-defining layer, the subpixel and the covering layer.

18. The display base plate according to claim 16, wherein a minimum distance between the recess along a direction parallel to a plane where the substrate is located and neighboring opening is greater than or equal to 1.35 μm.

19. A display apparatus, comprising the display base plate according to claim 1.

\* \* \* \* \*